United States Patent
Riley et al.

(10) Patent No.: US 6,760,351 B1
(45) Date of Patent: Jul. 6, 2004

(54) LIQUID IMMERSED PUMPED SOLID STATE LASER

(75) Inventors: Leon H. Riley, Huntsville, AL (US); George R. Edlin, Huntsville, AL (US); Brian R. Strickland, Huntsville, AL (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 10/273,610

(22) Filed: Oct. 21, 2002

(51) Int. Cl.$^7$ .................................................. H01S 3/04
(52) U.S. Cl. ............................................. 372/35; 372/34
(58) Field of Search ................................... 372/34, 35

(56) References Cited

U.S. PATENT DOCUMENTS

| | | | | |
|---|---|---|---|---|
| 4,168,474 A | * | 9/1979 | Pleasance | 372/4 |
| 4,580,268 A | * | 4/1986 | Barr et al. | 372/4 |
| 5,628,196 A | * | 5/1997 | Farmer | 62/51.1 |
| 6,195,372 B1 | * | 2/2001 | Brown | 372/34 |
| 6,448,501 B1 | * | 9/2002 | McIntyre et al. | 174/125.1 |
| 6,611,540 B1 | * | 8/2003 | Mueller | 372/35 |

* cited by examiner

Primary Examiner—Paul Ip
Assistant Examiner—Leith A Al-Nazer
(74) Attorney, Agent, or Firm—Alan P. Klein

(57) ABSTRACT

A liquid immersed pumped solid state lasing system comprising a light source and a lasing element spaced from the light source. The light source and the lasing element are mounted in an insulated container. The top of the container is open for inputting a clear cryogenic cooling liquid into the container to totally immerse the light source and the lasing element in the liquid. Heat transfer occurs by conduction from the light source and the lasing element to the liquid thereby cooling the light source and the lasing element to cryogenic temperatures. The container has a window for the output of laser light. A plurality of electrical leads which are superconducting at cryogenic temperatures are attached to the light source. When the leads are connected to a power supply outside the container, the light source directs light on the lasing element so that the lasing element is excited and transmits a light output through the window.

3 Claims, 2 Drawing Sheets

LIQUID IMMERSED PUMPED SOLID STATE LASER

BACKGROUND OF THE INVENTION

This invention relates in general to solid state lasers and more particularly to temperature control of such lasers.

In a pumped solid state laser, a light source, such as a Gallium Arsenide diode array, is energized by an electrical power supply that may be switched on and off. Light from the light source energizes a lasing element (a laser slab, rod, or other geometry device composed of a material such as Nd:YAG) causing a laser light output.

The energy that is inputted to this laser assembly and that is not outputted as laser light must be absorbed or be transmitted from the assembly as heat. The energy that is absorbed increases the temperature of the laser assembly. The temperature rise in the laser assembly can cause catastrophic failure of materials if it is not maintained within limits. The temperature rise can also cause optical dimensions to change so that laser operation is degraded or will not occur.

Convection is the primary means of cooling present day solid state lasers. A fan forces gases or vapors over and through the light source and the lasing element. The light source and the lasing element are cooled by gases or vapors which pass out of the laser assembly as heated gases after absorbing heat from the light source and the lasing element. Laser operation during convection cooling is not possible in many cases. The flow of gases or vapors can interrupt light transmission along optical paths. Therefore, convection cooling has to occur between laser operations. The result is long cooling times and short laser operating times. These cooling problems limit many solid state lasers to low duty cycle operation.

SUMMARY OF THE INVENTION

It is therefore an object of this invention to cool a laser in a simpler and improved manner.

This and other objects of the invention are achieved by a liquid immersed pumped solid state lasing system and method. The lasing system comprises a light source and a lasing element spaced from the light source. The light source and the lasing element are mounted in an insulated container. A means is provided for inputting a clear cryogenic cooling liquid into the container to totally immerse the light source and the lasing element in the liquid. Heat transfer occurs by conduction from the light source and the lasing element to the liquid thereby cooling the light source and the lasing element to cryogenic temperatures. The container has a window for the output of laser light. A plurality of electrical leads which are superconducting at cryogenic temperatures are attached to the light source. When the leads are connected to a power supply outside the container, the light source directs light on the lasing element so that the lasing element is excited and transmits a light output through the window.

By wetting the surfaces of the light source and the lasing element with a liquid, heat transfer from the laser components is much greater than could be obtained in a solid to gas interface. Use of a boiling liquid coolant, such as liquid nitrogen, keeps thermal gradients low in the lasing system. This reduces mechanical stresses on the laser components so that the laser's optical dimensions do not vary. Cooling at cryogenic temperatures increases the light output of light sources, such as GaAs diode arrays, in many cases, so that laser operation is more efficient. Cryogenic cooling permits the use of superconducting material for the power supply leads and interconnections within the matrix of GaAs diode light sources, resulting in a significant increase in laser efficiency and operational performance. Submersion of the diode arrays and the lasing element into the liquid cooling medium provides a laser of reduced complexity, reduced hardware requirements and reduced expense when compared to present techniques of cooling lasing systems of this type.

Additional advantages and features will become more apparent as the subject invention becomes better understood by reference to the following detailed description when considered in conjunction with the accompanying drawings wherein:

DETAILED DESCRIPTION

Figure 1:
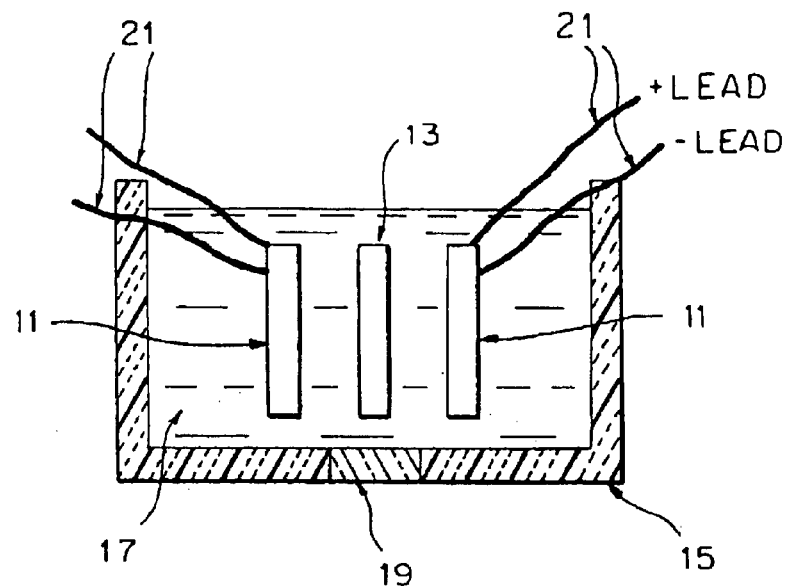
FIG. 1 is a cross-sectional side view of a first embodiment of the liquid immersed pumped solid state lasing system in accordance with the invention.
Figure 2:
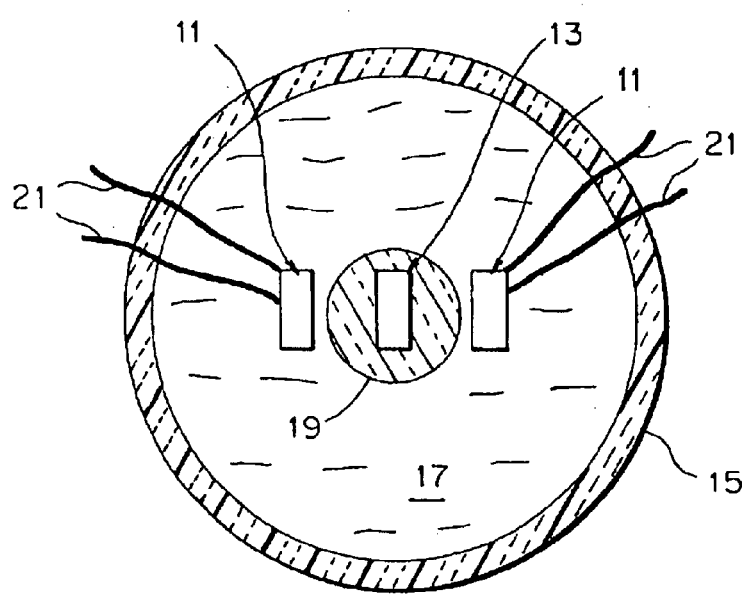
FIG. 2 is a cross-sectional top view of the first embodiment of the liquid immersed pumped solid state lasing system in accordance with the invention.

Referring now to the drawings, wherein like reference numerals designate identical or corresponding parts, FIGS. 1 and 2 show a first embodiment of the liquid immersed pumped solid state lasing system. The lasing system comprises a light source 11, consisting of a plurality of GaAs diode arrays, for example, and a lasing element 13, such as a Nd:YAG slab, spaced from the light source. The light source 11 and the lasing element 13 are mounted in an insulated container 15. Means, such as an opening in the top of the container 15, is provided for inputting a cryogenic cooling liquid 17. The inputted cryogenic cooling liquid 17 may be liquid nitrogen, for example. The bottom of the container 15 has a window 19 for output of laser light. A plurality of electrical leads 21 which are superconducting at cryogenic temperatures are attached to the light source 11. The leads may be, for example, high temperature superconductor wire available from the American Superconductor Corporation, Westborough, Mass. This wire is based on ceramic materials operating at the temperature of liquid nitrogen (−196 degrees C.).

In operation, a clear cryogenic cooling liquid 17 is inputted to the container 15 to totally immerse the light source 11 and the lasing element 13 in the liquid. Heat transfer occurs by conduction from the light source 11 and the lasing element 13 to the liquid, thereby cooling the light source and lasing element to cryogenic temperatures. When the superconducting electrical leads 21 are connected to a power supply (not shown) outside the container, the light source 11 directs light on the lasing element 13 so that the lasing element is excited and transmits a light output through the window 19.

Figure 3:
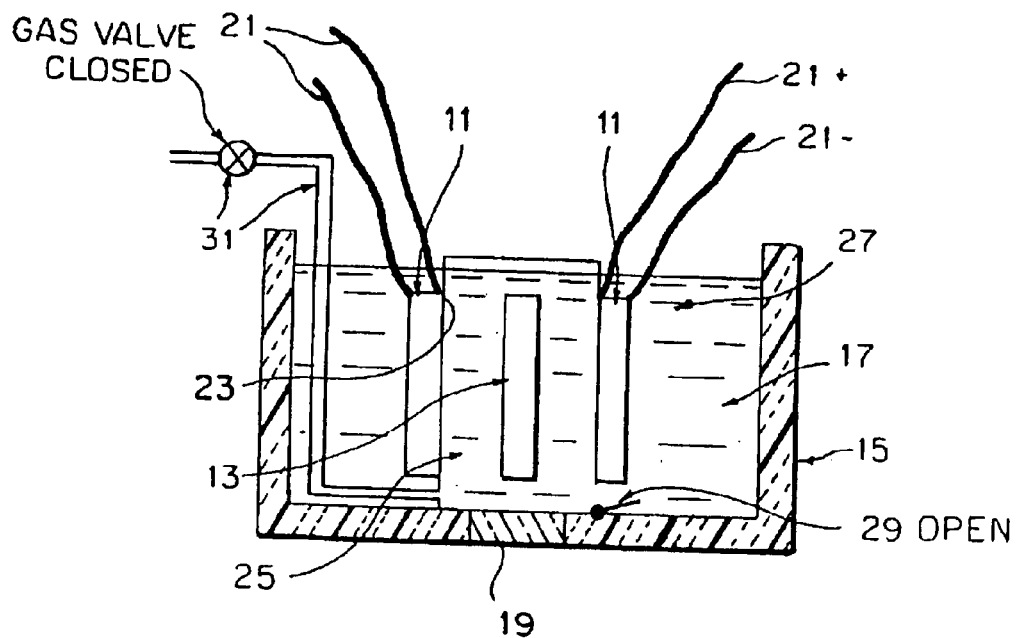
FIG. 3 is a cross-sectional side view of a second embodiment of the liquid immersed pumped solid state lasing system in accordance with the invention.
Figure 4:
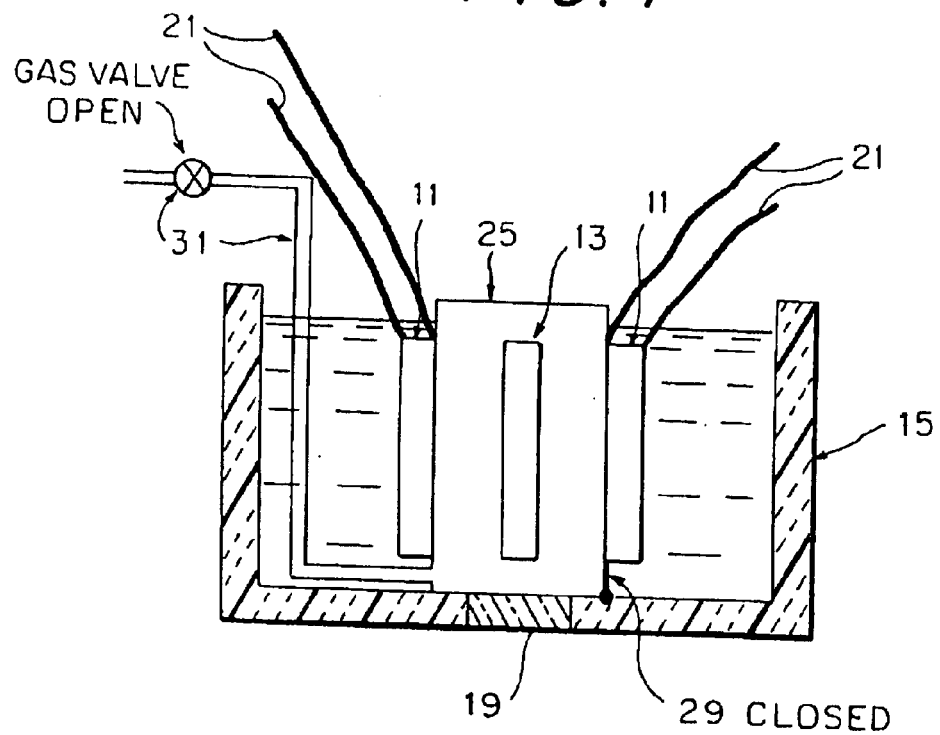
FIG. 4 is a cross-sectional side view of the second embodiment of the liquid immersed pumped solid state lasing system with the inner chamber purged of liquid in accordance with the invention.

FIGS. 3 and 4 show a second embodiment of the liquid immersed pumped solid state lasing system. It differs from the device shown in FIGS. 1 and 2 by the addition to the container 15 of an inner wall 23 defining an inner chamber 25 and an outer chamber 27. The inner wall 23 is sealed to the bottom of the container 15 and has a liquid entry means 29 (a valve, for example) for passing a cryogenic cooling liquid from the outer chamber 27 into the inner chamber 25, and a gas entry means 31 (a line equipped with a valve, for example) for passing a pressurized gas, such as helium, into the inner chamber 25 from a gas supply (not shown) outside the container. The light source 11, which may comprise a plurality of GaAs arrays, and the lasing element 13 are mounted in the inner chamber 25 with the lasing element 13 positioned over the window 19, and the light source forming a part of the inner wall 23.

The operation of the second embodiment differs from that of the device shown in FIGS. 1 and 2 in that the cryogenic cooling liquid is inputted to only the outer chamber 27 of the container and the liquid entry means 29 is activated to permit entry of the liquid from the outer chamber into the inner chamber 25 to totally immerse the light source 11 and the lasing element 13 in the liquid (FIG.3). When the light source 11 and the lasing element 13 are cooled to cryogenic temperatures, the liquid entry means 29 is deactivated and the gas entry means 31 is activated to permit entry of a pressurized gas into the inner chamber 25 to purge it of cooling liquid (FIG. 4). The superconducting electrical leads 21 are then connected to a power supply (not shown) outside the container 15, and the light source 11 directs light on the lasing element 13 so that the lasing element is excited and transmits a light output through the window 19. When the temperature rise of the lasing element 13 approaches its temperature limit for lasing, the superconducting electrical leads 21 are disconnected from the power supply outside the container 15, the gas entry means 31 is deactivated and the process is repeated. The second embodiment has the advantage of rapid cooling of laser components after laser operation. Laser operation occurs with the lasing element 13 surrounded by a gaseous medium and transmission of light from the light source 11 to the lasing element 13 is through the gaseous medium.

It is obvious that many modifications and variations of the present invention are possible in light of the above teachings. It is therefore to be understood that within the scope of the appended claims, the invention may be practiced otherwise than as described.

What is claimed as new and desired to be secured by Letters Patent of the United States is:

1. A lasing system comprising:

an insulated container having a window for output of laser light;

a light source mounted in the container;

a lasing element mounted in the container in spaced relationship from the light source, means for inputting a clear cryogenic cooling liquid into the container to totally immerse the light source and the lasing element in the liquid so that heat transfer occurs by conduction from the light source and the lasing element to the liquid thereby cooling the light source and the lasing element to cryogenic temperatures; and a plurality of electrical leads attached to the light source, the leads being superconducting at cryogenic temperatures;

whereby when the leads are connected to a power supply outside the container, the light source directs light on the lasing element so that the lasing element is excited and transmits a laser light output through the window, wherein the container has an inner wall defining an inner chamber and an outer chamber, the light source and the lasing element are mounted in the inner chamber, and the light source forms a part of the wall;

means for passing a cryogenic cooling liquid from the outer chamber into the inner chamber upon the liquid being inputted into the outer chamber; and means for passing a pressurized gas into the inner chamber to purge the inner chamber of cooling liquid after the liquid is permitted entry into the inner chamber from the outer chamber.

2. A lasing method comprising the steps of:

inputting a clear cryogenic cooling liquid into a container containing a lasing element and a light source having a plurality of superconducting electrical leads to totally immerse the light source and the lasing element in the liquid so that heat transfer occurs by conduction from the light source and the lasing element to the liquid thereby cooling the light source and the lasing element to cryogenic temperatures, wherein the inputting step includes passing the cooling liquid from an outer chamber into an inner chamber containing the lasing element and the light source upon the liquid being inputted into the outer chamber;

connecting the superconducting electrical leads to a power supply outside the container so that the light source directs light on the lasing element whereby the lasing element is excited arid transmits a laser light output through a window in the container;

passing pressurized gas into the inner chamber to purge the inner chamber of the cooling liquid; and disconnecting the leads from the power supply when the temperature rise of the lasing element approaches its temperature limit for lasing.

3. A lasing system comprising:

an insulated container having a top and a bottom and a window for output of laser light;

a light source mounted in the container;

a lasing element mounted in the container in spaced relationship from the light source;

the top of the container being open for inputting a clear cryogenic cooling liquid into the container to totally immerse the light source and the lasing element in the liquid so that heat transfer occurs by conduction from the light source and the lasing element to the liquid thereby cooling the light source and the lasing element to cryogenic temperatures; and a plurality of electrical leads attached to the light source, the leads being superconducting at cryogenic temperatures;

whereby when the leads are connected to a power supply outside the container, the light source directs light on the lasing element so that the lasing element is excited and transmits a laser light output through the window, wherein the container has an inner wall defining an inner chamber and an outer chamber, the light source and the lasing element are mounted in the inner chamber, and the window is on the bottom of the container;

means for passing a cryogenic cooling liquid from the outer chamber into the inner chamber upon the liquid being inputted into the outer chamber from the top of the container; and means for passing a pressurized gas into the inner chamber to purge the inner chamber of cooling liquid after the liquid is permitted entry into the inner chamber from the outer chamber.

* * * * *